United States Patent
Braun et al.

(10) Patent No.: US 7,852,163 B2
(45) Date of Patent: *Dec. 14, 2010

(54) BATCH-FABRICATED, RF-INTERROGATED, END TRANSITION, CHIP-SCALE ATOMIC CLOCK

(75) Inventors: Alan Michael Braun, Lawrenceville, NJ (US); Joseph Hy Abeles, East Brunswick, NJ (US); Winston Kong Chan, Princeton, NJ (US); Martin Kwakernaak, New Brunswick, NJ (US); Timothy James Davis, Columbus, NJ (US)

(73) Assignee: Sarnoff Corporation, Princeton, NJ (US)

( * ) Notice: Subject to any disclaimer, the term of this patent is extended or adjusted under 35 U.S.C. 154(b) by 149 days.

This patent is subject to a terminal disclaimer.

(21) Appl. No.: 12/273,852

(22) Filed: Nov. 19, 2008

(65) Prior Publication Data
US 2009/0066430 A1 Mar. 12, 2009

Related U.S. Application Data

(63) Continuation of application No. 11/736,657, filed on Apr. 18, 2007, now Pat. No. 7,468,637.

(60) Provisional application No. 60/793,171, filed on Apr. 19, 2006.

(51) Int. Cl.
*H01S 1/06* (2006.01)
*H03L 7/26* (2006.01)

(52) U.S. Cl. .......................... 331/94.1; 331/3
(58) Field of Classification Search ............... 331/94.1, 331/3
See application file for complete search history.

(56) References Cited

U.S. PATENT DOCUMENTS

| | | | |
|---|---|---|---|
| 3,667,066 A | 5/1972 | Kastler et al. | |
| 4,454,482 A | 6/1984 | DeMarchi | |
| 6,888,780 B2 | 5/2005 | Happer et al. | |
| 7,173,421 B2 | 2/2007 | Hannah | |
| 7,323,941 B1 | 1/2008 | Happer et al. | |
| 2004/0202050 A1* | 10/2004 | Happer et al. | 368/10 |
| 2006/0022761 A1* | 2/2006 | Abeles et al. | 331/94.1 |
| 2008/0042761 A1* | 2/2008 | Happer et al. | 331/94.1 |

* cited by examiner

*Primary Examiner*—Vibol Tan
(74) *Attorney, Agent, or Firm*—Lowenstein Sandler PC

(57) ABSTRACT

A chip scale atomic clock is disclosed that provides a low power atomic time/frequency reference that employs direct RF-interrogation on an end-state transition. The atomic time/frequency reference includes an alkali vapor cell containing alkali atoms, preferably cesium atoms, flex circuits for physically supporting, heating, and thermally isolating the alkali vapor cell, a laser source for pumping alkali atoms within the alkali vapor cell into an end resonance state by applying an optical signal along a first axis, a photodetector for detecting a second optical signal emanating from the alkali vapor cell along the first axis, a pair of RF excitation coils for applying an RF-interrogation signal to the alkali atoms along a second axis perpendicular to the first axis, a pair of bias coils for applying a uniform DC magnetic field along the first axis, and a pair of Zeeman coils for applying a Zeeman interrogation signal to the alkali atoms and oriented and configured to apply a time-varying magnetic field along the second axis through the alkali vapor cell. Another flex circuit is used for physically supporting the laser source, for heating the laser source, and for providing thermal isolation of the laser source. The laser source can be a vertical cavity surface emitting laser (VSCEL). The bias coils can be Helmholtz coils.

26 Claims, 11 Drawing Sheets

RF (9.2 GHz; x-axis)
Zeeman* (~30 kHz, x-axis)

Atomic Physics:
- Hyperfine End-resonance $$f_e = f_{00} + 7\eta |B| \quad (1)$$

- Zeeman Resonance $$f_z = \eta |B| \quad (2)$$

End-resonance Clock Electronics:
- LO is Locked to the End-resonance
- Zeeman Resonance is Locked to a Fixed Fraction of the LO Frequency $$f_z = f_e/N; f_{LO\_Z} = f_{LO}/N \quad (3)$$

(N is on the Order of $10^5$)

| Component | PD (mW) | Idd (mA) |
|---|---|---|
| MMIC VCO HMC429 | 100 | 30.3 |
| MCU MSP430F1611 | 15 | 4.5 |
| PLL LM2487 | 20 | 6.1 |
| PLL Loop Filter | 0.3 | 0.1 |
| PLL Sweep Switch | 0.57 | 0.2 |
| Doubler - Marchand Balun | 6 | 1.8 |
| VCSEL RTD | 0.2 | 0.1 |
| CELL Input RTD | 0.2 | 0.1 |
| CELL Output RTD | 0.2 | 0.1 |
| RTD Inst Amps x 3 | 0.6 | 0.2 |
| Photodiode TIA / Filter | 0.8 | 0.2 |
| 4:1 Analog Mux | 0.0033 | 0.0 |
| ADC, 16-Bit Pulsar AD7685 | 2 | 0.6 |
| Quad 16-Bit DAC x 2 | 5.6 | 1.7 |
| Precision VREF | 1.65 | 0.5 |
| Cell Input Heater ISource | 0.455 | 0.1 |
| Cell Output Heater ISource | 0.455 | 0.1 |
| X-Axis ISource | 0.455 | 0.1 |
| B-Field ISource | 0.455 | 0.1 |
| VCSEL ISource | 0.455 | 0.1 |
| VCSEL Heater ISource | 0.455 | 0.1 |
| TVCXO ISource | 0.455 | 0.1 |
| TVCXO - Vectron | 6.6 | 2.0 |
| TVCXO Translator / Divider | 2 | 0.6 |
| VCO, Z-Comm SMV4596A | 40 | 12.1 |
| Total Power (mW) | 165 | |
| Total (Z-Comm) Power (mW) | 105 | |

- Microprocessor control
- Initial board configured with desig margin
  - Computer interface
  - Separate digital, RF boards
  - RF amplitude control
- VCO dominant power consumption:
  - 100 mW VCO (Hittite)
  - 40 mW VCO (Z-comm)
  - 10 mW VCO (Custom)

*Electronics Power Budget:*
*75 mW to 165 mW (VCO Dependent)*

FIG. 13

BATCH-FABRICATED, RF-INTERROGATED, END TRANSITION, CHIP-SCALE ATOMIC CLOCK

CROSS-REFERENCE TO RELATED APPLICATIONS

This application is a continuation of U.S. utility application Ser. No. 11/736,657, filed Apr. 18, 2007, which claims the benefit of U.S. provisional patent application No. 60/793,171 filed Apr. 19, 2006, the disclosures of which are incorporated herein by reference in their entirety.

GOVERNMENT RIGHTS IN THIS INVENTION

This invention was made with U.S. government support under contract number NBCHC020045. The U.S. government has certain rights in this invention.

FIELD OF THE INVENTION

The present invention relates generally to atomic clock, and more particularly to an atomic clock that operates by means of radio frequency (RF) interrogation operating on an end-transition state of an atomic vapor.

BACKGROUND OF THE INVENTION

Atomic clocks have been used in systems that require a very accurate time base or frequency measurement. Typical applications include global positioning systems (GPS) satellites, cellular phone systems, scientific experiments, and military applications. Conventional atomic clocks operate by use of an optical source (typically lamp-based, but some are laser-based) to "pump" atoms into the classical "0-0" state. The "0-0" state is the transition between an upper energy level with azimuthal quantum number 0 and total angular momentum quantum number $f=I+\frac{1}{2}$ and a lower energy level with azimuthal quantum number 0 and total angular momentum quantum number $f=I-\frac{1}{2}$. In such systems, a microwave field is coupled into a microwave cavity enclosing an atomic vapor cell and, operating under feedback control, the microwave frequency of the microwave field is locked to the atomic 0-0 frequency state. The locking on to the atomic 0-0 frequency state by means of an applied microwave frequency field is called RF-interrogation.

In many existing and emerging applications, it is desirable that the dimensions of the atomic clock be small with low power consumption requirements. If the dimensions of the atomic clock are sufficiently small, then many parts comprising the clock can be manufactured using similar batch fabrication techniques as those found in the semiconductor industry.

Limitations of conventional atomic clocks include the use of microwave cavities which limit the clock dimensions as well as place a limit on performance/applications due to cavity pulling effects. A microwave cavity was needed in order to produce a uniform RF field of sufficient RF power when using larger bulb-style alkali-vapor cells.

As is known in the art, the microwave cavity can be eliminated by use of a modulated optical source in a technique called Coherent Population Trapping: (CPT). By modulating the optical source at the atomic hyperfine frequency (the 0-0 frequency), the optical sidebands can interact with the atoms in a way analogous to direct RF interrogation, yet without needing bulky microwave cavity components. In CPT, an optical laser is modulated with microwave power. The laser responds by generating optical sidebands that are positioned about that main laser line at a frequency equal to the modulating RF frequency (or at a harmonic or sub-harmonic). Feedback electronics is used to lock the frequency of an electronic VCO to the atomic hyperfine resonance, which is sensed by the interaction of the coherent optical frequency sideband spectrum and the alkali atoms.

A novel variant is to utilize the atomic "end-transition" as opposed to the classical 0-0 transition. The end-transition allows for scaling the clock physics package (reduced dimensions) without seriously affecting clock performance. End transition interrogation allows for optical pumping of atoms into a common state (maximum or minimum of angular momentum), thereby providing for increased signal strength, suppression of spin-exchange broadening, and with high buffer gas pressure, allowing for scaling of alkali-vapor cells to the millimeter or sub-millimeter dimensions. End-transition interrogation allows for the production of strong signals (high performance) as cell size is reduced, which in turn allows for the production of an extremely compact, low power dissipation, yet high performance atomic clock source.

Several end-transition architectures can be implemented, including ones that use a microwave cavity or are CPT-based. For millimeter-scale alkali-vapor cells, direct RF-interrogation is the preferred approach: no microwave cavity is needed as the vapor cells (and feed loops) are of dimensions less than one RF wavelength (9.19 GHz for cesium; i.e. a wavelength of about 3 cm in free space). Therefore, RF uniformity and drive power are satisfied without need for microwave resonator. Further, incomplete polarization pumping from a single circularly polarized laser reduces the effectiveness of end-transition CPT techniques.

As the end-transitions are linearly dependent on local magnetic fields, an approach is taken to actively lock the local field to a pre-determined value. This approach involves the direct sensing of an atomic resonance used as a measure of the local field value, and with feedback electronics, maintains the local bias field at a constant value.

Long-term stability of optically-pumped clocks is degraded due to the varying amount of optical power being absorbed by the atoms, so-called "light shifts". An advantage of the end-state approach is that, since light shifts (AC Stark shifts) look like magnetic field shifts, an active magnetic field feedback system can be designed to also actively compensate for light shifts, a technique not possible with designs based on the 0-0 transition, which is quadratically dependent on magnetic field.

Accordingly, what would be desirable, but has not yet been provided, is high performance, compact (and scalable), low power atomic time/frequency reference that employs direct RF-interrogation on the end-state transition. Such a system can include compact, non-contact RF-interrogation as well as appropriate bias-field input and control.

SUMMARY OF THE INVENTION

The above-described problems are addressed and a technical solution is achieved in the art by providing a chip scale atomic clock that provides a low power atomic time/frequency reference that employs direct RF-interrogation on an end-state transition. The atomic time/frequency reference includes an alkali vapor cell containing alkali atoms, preferably cesium atoms; a laser source in optical communication with the alkali vapor cell for pumping an optical signal through the alkali atoms, the alkali atoms being excited into an end resonance state; a photodetector in optical communication with the alkali vapor cell and configured to detect the optical signal, wherein the laser source, the alkali vapor cell, and the photodetector are aligned along a first axis; a pair of RF excitation coils for applying an RF-interrogation signal having a wavelength that is larger than the dimensions of the alkali vapor cell to the alkali atoms substantially along a second axis perpendicular to the first axis through said alkali vapor cell, each of the pair of RF excitation coils being proximal to and physically isolated from the alkali vapor cell; a pair of bias coils for applying a substantially uniform DC magnetic field along the first axis through the alkali vapor cell, each of the pair of bias coils being located external to and physically and thermally isolated from the alkali vapor cell; and a pair of Zeeman coils for applying a Zeeman interrogation signal to the alkali atoms and oriented and configured to apply a time-varying magnetic field along the second axis through said alkali vapor cell, each of the pair of Zeeman coils being located external to and physically and thermally isolated from the alkali vapor cell.

A pair of flex circuits is used for physically supporting said alkali cell, for heating said alkali vapor cell, and for providing thermal isolation to the alkali vapor cell. A third flex circuit is used for physically supporting the laser source, for heating the laser source, and for providing thermal isolation of the laser source. The laser source can be a vertical cavity surface emitting laser (VSCEL). The bias coils can be Helmholtz coils. The atomic clock also includes: a bobbin for supporting and orienting the bias coils and the Zeeman coils; a ceramic spacer for separating the first and the second flex circuits and for encasing and orienting the alkali vapor cell and the RF interrogation coils; a package header underlying the third flex circuit for providing electrical signal connections to the bias coils, the Zeeman coils, the RF interrogation coils, the laser, the heaters and temperature sensors within the flex circuits; a package lid having an evacuation port for providing a thermally-isolating vacuum environment for the Alkali vapor cell and the laser source, the package lid overlying the package header; and a lower layer magnetic shield underlying the package header and an upper layer magnetic shield overlying the bobbin.

A number of feedback loops can apply and detect signals to and from the coils and laser source. A first feedback loop maintains a local-oscillator frequency of the RF interrogation signal of about 9.19 GHz (cesium) by applying RF power with FM dither to the RF excitation coils and detecting from the photodetector a demodulated dithering signal of about 2.9 KHz. An atomic clock time base of about 10 MHz is derived from this feedback loop in a conventional way. A second feedback loop derives the drive frequency from the first clock loop, and maintains a frequency of a Zeeman interrogation signal of about 30 KHz, by applying to the Zeeman interrogation coils power of such a frequency (determined by the value of the magnetically split Zeeman sublevels) being FM dithered and detecting from the photodetector a demodulated dither signal of about 700 Hz. The DC response from this feedback loop is used to adjust the magnitude of the local bias magnetic field, to compensate for external magnetic fields and to compensate for clock frequency shifts due to light shifts. A third feedback loop maintains the optical wavelength by applying an FM-modulated dither signal of about 23 kHz to the laser constant current source, with detected and demodulated signal fed back to either the drive current source or laser temperature controller. Exact value of dither frequency can be adjusted, but should be at roughly equal to the resonance linewidths for enhanced signal-to-noise.

BRIEF DESCRIPTION OF THE DRAWINGS

The present invention will be more readily understood from the detailed description of exemplary embodiments presented below considered in conjunction with the attached drawings, of which:

FIG. 13 is a parts list of the supporting control and servo-feedback loop electronics used in conjunction with the present invention.

It is to be understood that the attached drawings are for purposes of illustrating the concepts of the invention and may not be to scale.

DETAILED DESCRIPTION OF THE INVENTION

Figure 1:
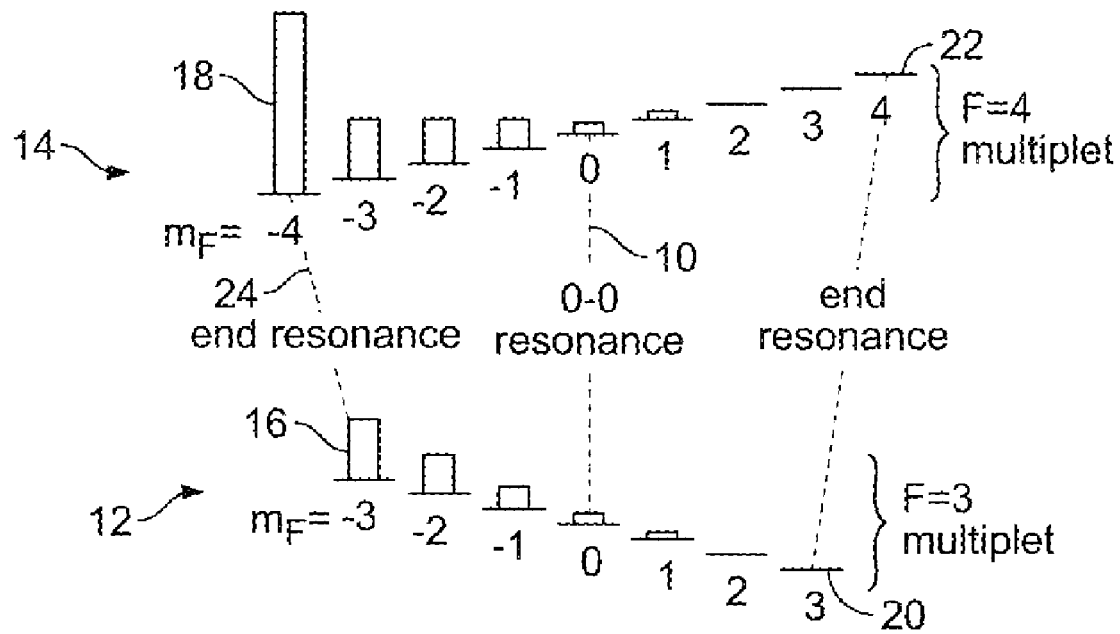
FIG. 1 is a schematic diagram showing the transition states of an atomic clock vapor in the presence of magnetic fields, in accordance with an embodiment of the present invention.

FIG. 1 depicts the transition states of the atoms of an atomic clock vapor in the presence of magnetic fields. (For the present discussion, the atomic vapor can be made of cesium atoms, but the technique described below is applicable to any alkali element). The 0-0 transition (resonance) 10 is exhibited after the Zeeman sublevels are split in an external magnetic field. With no magnetic field applied, all the Zeeman sublevels occupy the same energy levels of the 0-0 transition 10.

Applying a DC magnetic field causes the states 12, 14 to separate into a number of lower 12 and upper 14 Zeeman transition states at different energy levels. The states with the minimum difference in energy 16, 18, or left end resonance, and the maximum difference in energy 20, 22, or right end resonance, are called the end states (resonances).

Figure 2:
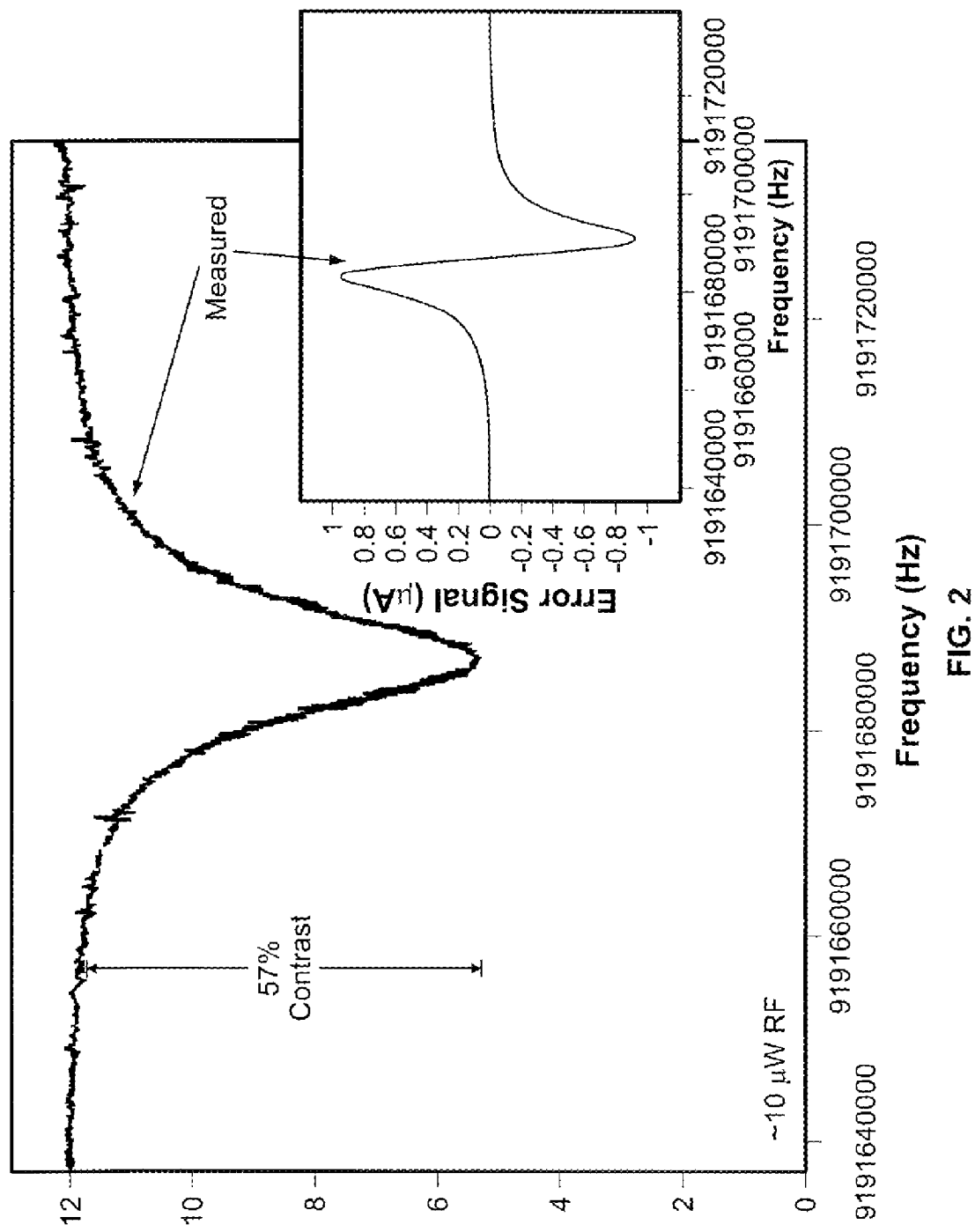
FIG. 2 is plot of pulse contrast vs. frequency for an end-transition resonance interrogated with RF, in accordance with an embodiment of the present invention.

The desired end-transition states for use in the present invention are the minimum end states (resonance) 16, 18 or maximum state. An optical vertical cavity surface emitting laser (VSCEL) is used to pump the majority of alkali atoms into these states (selected by use of either "right" or "left" circularly polarized light), as exhibited by the larger vertical bars. Atomic processes tend to scatter the atoms in these states back to the right of the diagram. The VSCEL provides the spin angular momentum necessary to overcome those scattering processes to keep the atoms in the appropriate end-transition. Referring now to FIG. 2, when the end-transition 24 is interrogated with RF, a strong atomic spin resonance dip in the plot of pulse contrast vs. frequency results. Electronic servo feedback loops employed in some embodiments of the present invention ensure that the electronic local-oscillator frequency maintains a lock onto this atomic resonance, allowing for stable clock output frequency. End-transition pumping provides very large resonance signals, allowing for increased system signal-to-noise in the locking process, yielding increased clock stability.

Figure 3:
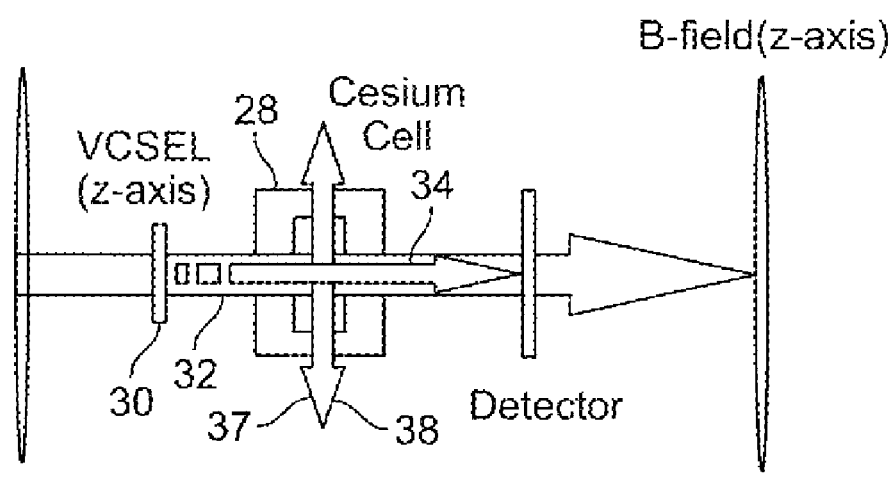
FIG. 3 is a schematic diagram of end-state geometry of electromagnetic signals being applied to an alkali vapor cell, according to an embodiment of the present invention.

Referring now to FIG. 3, a schematic diagram of End-State geometry of electromagnetic signals being applied to an alkali vapor cell 28 is depicted, according to an embodiment of the present invention. At the left of FIG. 3 is a VSCEL 30, whose laser light 32, which is circular polarized either naturally or through appropriate polarization optics, is applied to the alkali vapor cell 28 along a horizontal or "z-axis" axis. A second DC magnetic field 34 is also applied along the z-axis. A microwave, RF-interrogation field 38, preferably in the range of 9.19 GHz (for the case of cesium), is applied to the alkali vapor cell 28 along an "x-axis" (or "y-axis") which is perpendicular to the z-axis with the alkali vapor cell 28 at the origin of the two axes. A second RF or Zeeman field 37, which can range in frequency from about 10 KHz to 300 KHz, preferably 30 KHz, to match the Zeeman splitting frequency, is also applied to the alkali vapor cell 28 along the x-axis.

Figure 4:
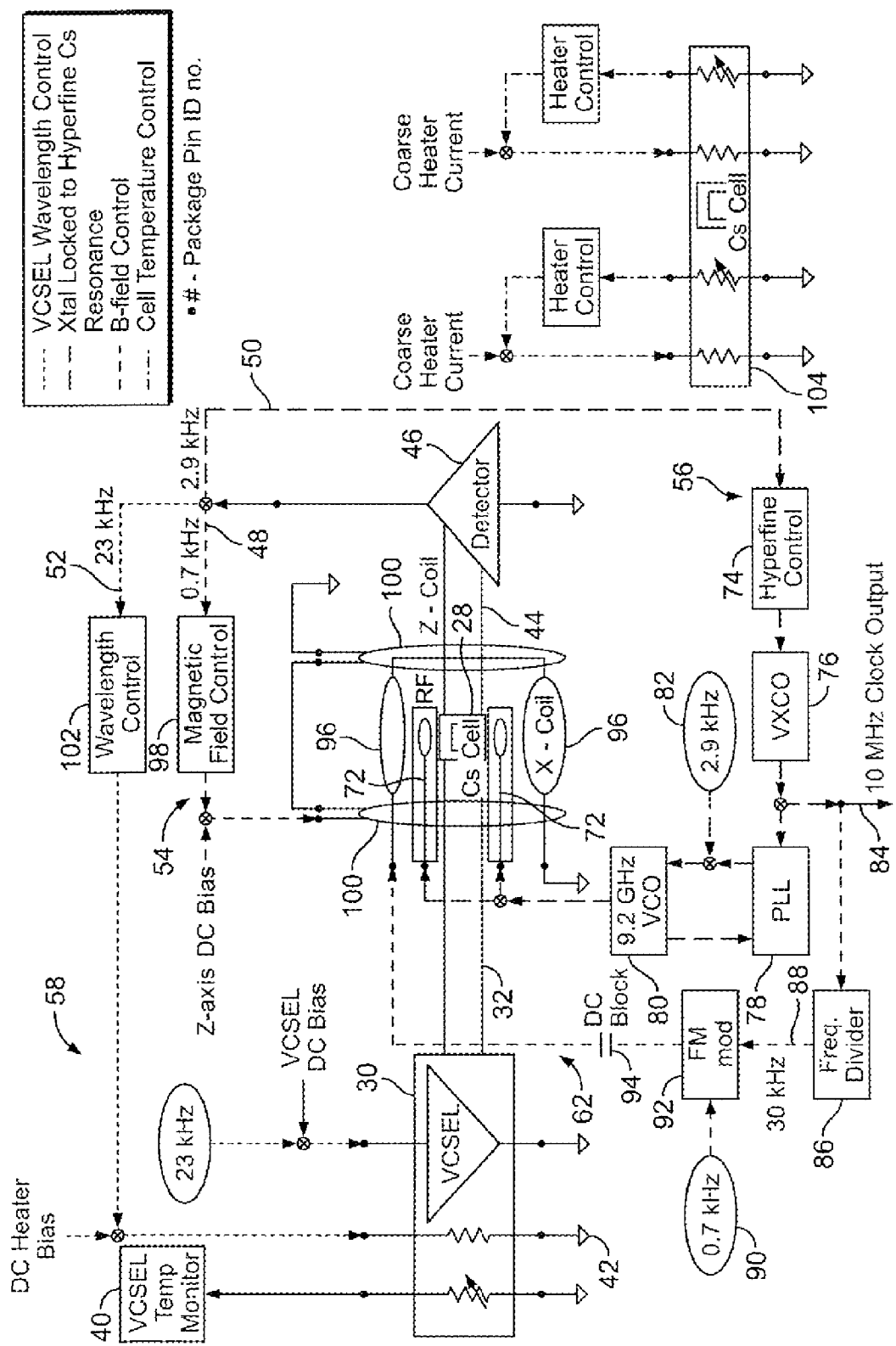
FIG. 4 is a circuit diagram of end-state geometry with feedback loops depicted in greater detail, according to the embodiment of FIG. 3.

Referring now to FIG. 4, a circuit diagram of end-state geometry with servo feedback loops is depicted in greater detail, according to the embodiment of the present invention of FIG. 3. A VSCEL 30 thermally coupled to a VSCEL temperature monitor 40 and DC bias heater 42 keeps the VSCEL 30 it at a constant temperature to prevent the VSCEL wavelength from drifting. The VSCEL laser light 32 is applied to the alkali vapor cell 28 along the "z-axis." A modulated and otherwise modified VSCEL laser light signal 44 emanates from the alkali vapor cell 28 along the z-axis, which is received by a photodetector 46. A VCSEL emits a continuous-wave in nature, although will accept low frequency FM modulation. A plurality of feedback signals 48, 50, 52 are derived from the output of the photodetector 46, respectively for use in a plurality of servo feedback loops 54, 56, 58, respectively. The feedback loops 54, 56, 58, maintain a constant DC magnetic field 34 for producing the Zeeman energy levels, a 9.19 GHz microwave RF-interrogation field as the clock frequency 38, and a VSCEL wavelength stabilization control (heater) signal for the VSCEL DC bias heater 42, respectively. A fourth feedback loop 62, derived from the RF interrogation feedback loop 56, is for applying a 30 KHz Zeeman end transition resonance.

A pair of coils 72, preferably as single-turn coils, apply the 9.19 Ghz RF-interrogation field 38 along the x-axis through the alkali vapor cell 28. The 9.19 Ghz RF-interrogation field 38 is applied via the feedback loop 56 which includes a standard hyperfine control block 74, a voltage-controlled crystal oscillator (VXCO) 76, a phase-locked loop (PLL) 78, and a 9.19 Ghz voltage-controlled oscillator (VCO) 80 which is FM modulated (dithered) by a 2.9 KHz source 82. The 9.19 Ghz RF source is swept across the microwave resonance of the cesium atoms discussed above. The hyperfine control block 74 senses and extracts the 2.9 KHz signal emanating from the photodetector 46 which drives the VXCO 76. An output of the VXCO 76 derives a 10 MHz clock output 84. The 10 MHz clock output 84 is also fed to the PLL 78. The VXCO 76, the PLL 78, and the 2.9 KHz source control the frequency of the VCO 80 and lock it on 9.19 Ghz.

The 10 MHz clock output 84 is also fed through a frequency divider 86 to derive a 30 KHz source 88 which is modulated by a 700 Hz source 90 via a frequency modulator 92. This signal is AC coupled via coupling capacitors 94 to a pair of coils 96 which apply a 30 KHz signal to the alkali vapor cell 28 along the x-axis. A magnetic field control block 98 senses and extracts the 700 Hz signal 48 emanating from the photodetector 46 which drives, adjusts, and applies a DC bias current to a pair of coils 100 for applying a DC magnetic field along the z-axis to the alkali vapor cell 28. The DC field remains at a constant value despite the presence of stray magnetic fields. As mentioned above, the Z-axis DC magnetic field causes the Zeeman states to separate from the 0-0 state into several energy levels, to which the VSCEL 30 pumps the cesium atoms in the alkali vapor cell 28 to the end state. The DC magnetic field (B field) bias feedback loop 54 of the present invention overcomes both the problem of stray magnetic field and light shifts often associated with end-state atomic clock systems.

The wavelength control block 102 senses and extracts the 23 KHz VSCEL wavelength control (heater) signal 52 for adjusting the temperature of the VSCEL DC bias heater 42 to maintain the VSCEL 30 at a constant wavelength. In the bottom right corner of the diagram is a box 104 which shows that both the VSCEL 30 and the alkali vapor cell 28 can be heated and maintained at constant temperatures. For the alkali vapor cell 28, the cesium atom are preferably maintained at a temperature of about 105° C. to keep the cesium at a vapor pressure that is optimum for RF interrogation. If the temperature of the cesium atoms fluctuates, so too can the frequency of the derived clock reference.

Figure 5:
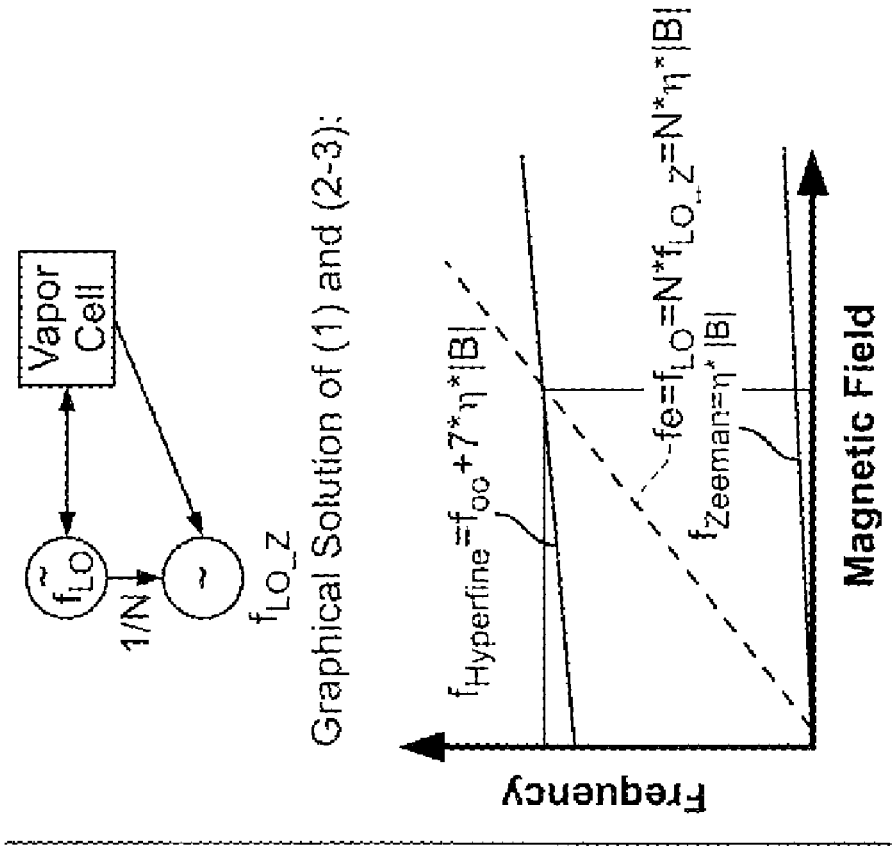
FIG. 5 is a graph illustrating how the local oscillator and Zeeman resonance lock to a stable operation point, according to an embodiment of the present invention.

The various FM modulation signals dither the main frequencies of applied signals to oscillate about nominal values. The servo feedback loops employ dithering signals to "lock" onto fixed values. FIG. 5 is a graph illustrating how the local oscillator and Zeeman resonance lock to a stable operation point. As shown by the graph, the local oscillator frequency, $f_{LO}$, running at 9.19 Ghz, and $f_{LO\_z}$, the Zeemen resonance oscillator, are related by a factor N, such that $f_{LO\_z}=f_{LO}/N$, where N is on the order of $10^5$. The graphs of the hyperfine end-resonance intersects the local oscillator graph at precisely the stable Zeeman resonance point, such that a small shift in the local oscillator frequency of 9.19 Ghz can be corrected by a small shift in the local magnetic field of the Zeeman loop because of the $N \cong 10^5$ lever arm.

Figure 6:
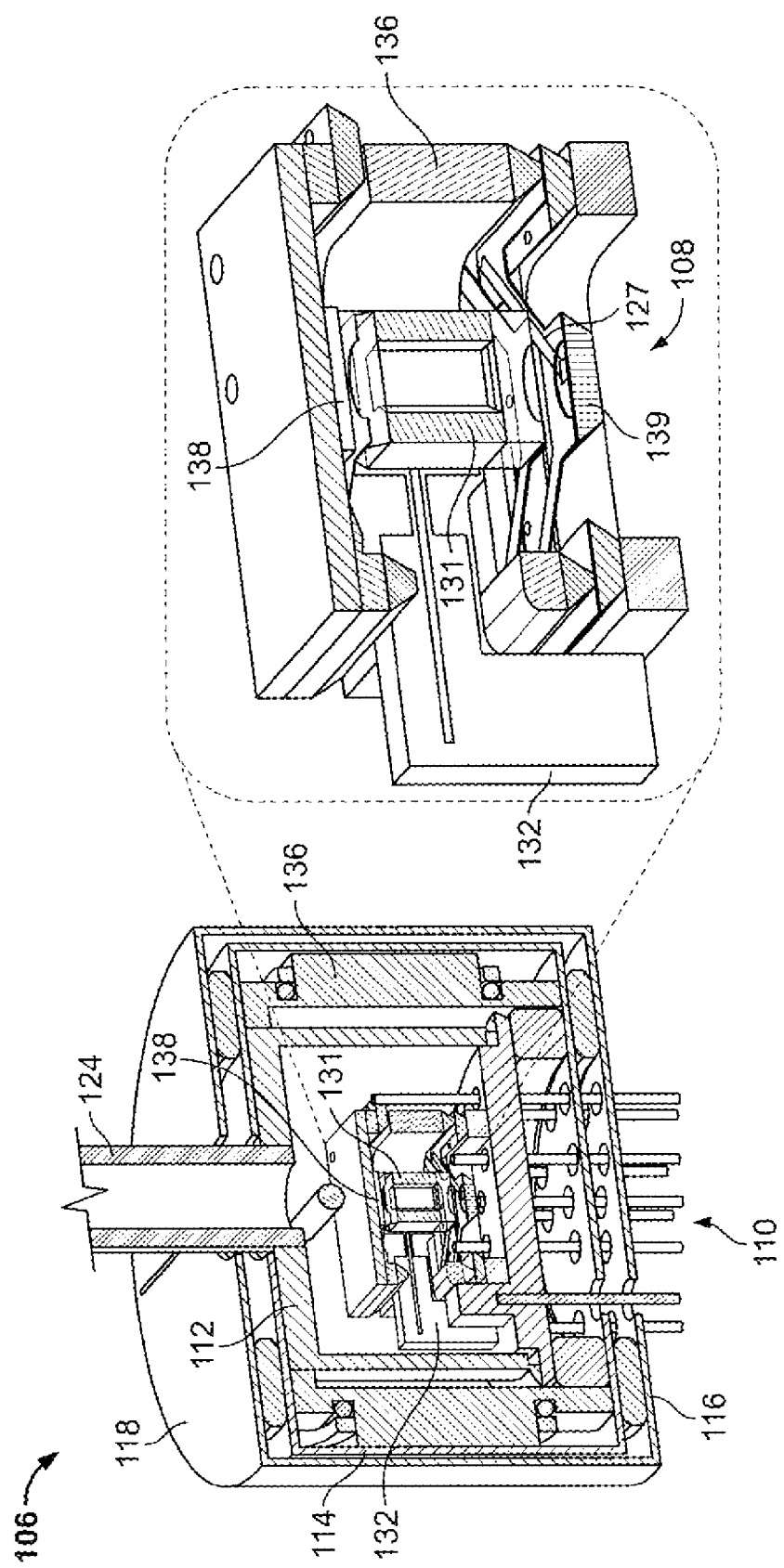
FIG. 6 is a perspective view of a physics package assembly, constructed in accordance with an embodiment of the present invention.
Figure 7:
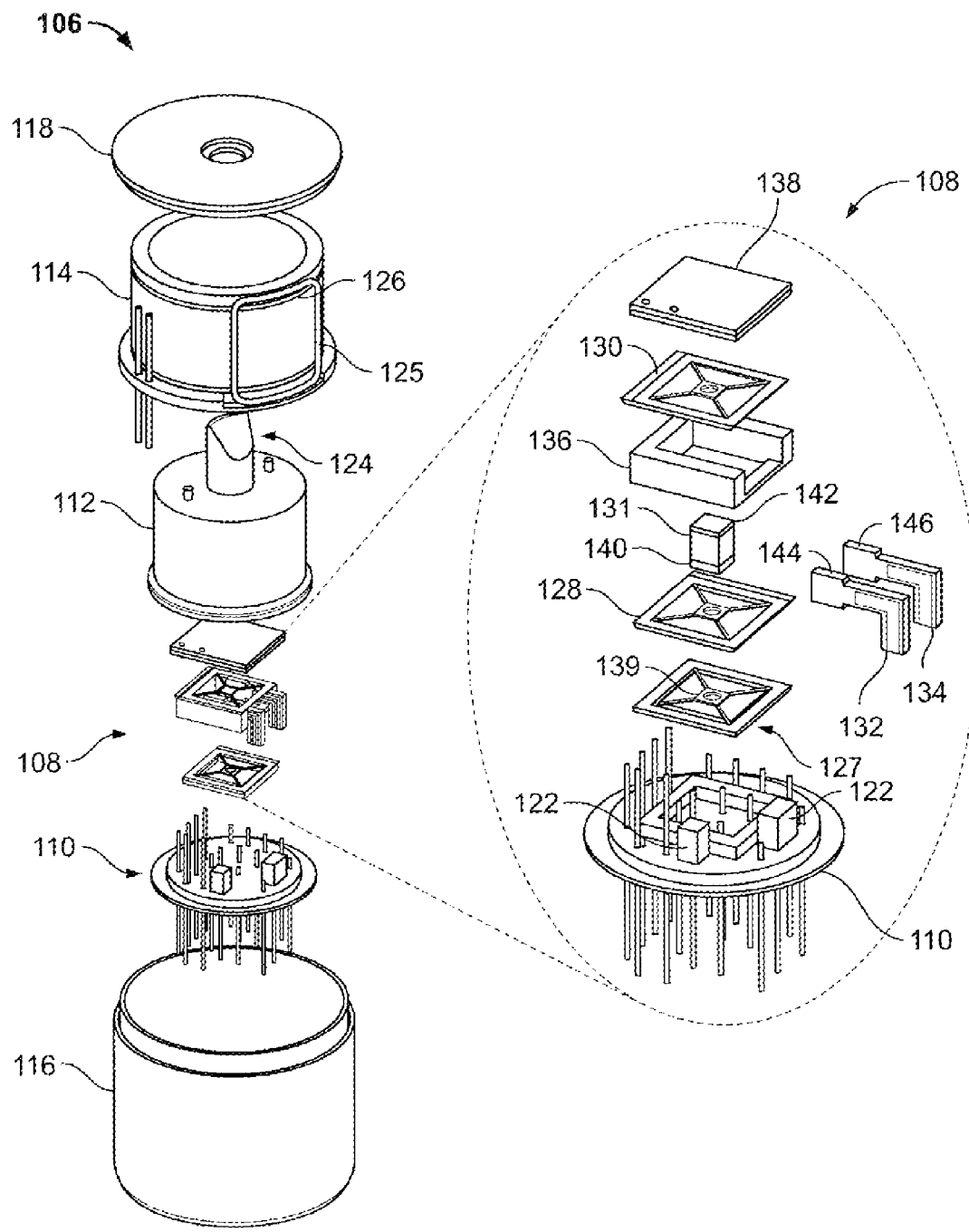
FIG. 7 is an exploded view of the physics package assembly of FIG. 6.

Referring now to FIGS. 6 and 7, a physics package assembly 106 constructed in accordance with the present invention is depicted. The physics package assembly 106 includes a physics package 108 to be discussed hereinbelow, a package header 110, a package lid 112, a bobbin 114, and lower and upper magnetic shields 116, 118, respectively. The package header 110 provides the electronic input/output pin connections between the physics package 108 and external electronics (not shown), such as the servo feedback loop circuitry. The package header 110 is also provided with blocks 122 for aligning the components of the physics package 108. The package lid 112, vacuum sealed to the package header 110, encases the physics package 108. A vacuum environment is desirable so as to prevent convective heat loss from the physics package 108 and prevent convective flow which can degrade differential temperature between an alkali vapor cell and a VCSEL. Air is removed via an evacuation port 124 extending from the package lid 112. The package header 110 and the package lid 112 are preferably made of non-magnetic titanium, but could as well be made of other non-magnetic materials, such as ceramic. The volume enclosed by the package header 110 and the package lid 112 is approximately 3 $cm^3$ or less.

The bobbin 114 overlies the package lid 112, and provides a base for both the x-axis magnetic coil 125 providing the Zeeman excitation and the z-axis magnetic coil providing the DC magnetic bias to the physics package 108. The assembly is encased in two layers of magnetic shielding provided by the lower magnetic shields 116 and the upper magnetic shield 118. The overall diameter of the physics package assembly 106 is less than about 2 cm, while the overall volume of the physics package assembly 106 is about 7 $cm^3$ or less.

The physics package 108 includes three flex circuits of similar design for providing thermal control of the physics package 108 to be discussed hereinbelow, i.e., a VSCEL/heater/Resistance Temperature Detector (RTD) flex circuit 127, a lower heater/RTD flex circuit 128, and an upper heater/RTD 130 flex circuit. The physics package 108 also includes an alkali vapor cell 131, a pair of RF excitation coils 132, 134, a ceramic spacer 136, and a photodiode 138. The VSCEL/Heater/RTD flex circuit 127 is aligned within the alignment blocks 122 of the package header 110. A VSCEL 139 is located overlying the center of the VSCEL/heater/RTD flex circuit 127. The lower heater/RTD flex circuit 128 then overlies the VSCEL/Heater/RTD flex circuit 127 also aligned within the alignment blocks 122. One end 140 of the alkali vapor cell 131 sits over the center of the lower heater/RTD flex circuit 128. The lower heater/RTD flex circuit 128 is separated from the upper heater/RTD 130 flex circuit by the ceramic spacer 136. The ceramic spacer 136 also aligns the center of the upper heater/RTD 130 flex circuit with the other end 142 of the alkali vapor cell 131. The L-shaped RF excitation coils 132, 134 are inserted within the spaces between the ceramic spacer 136 and the alkali vapor cell 131 and aligned such that the front portions 144, 146 of the RF excitation coils 132, 134 line up with the center of the alkali vapor cell 131. The RF excitation coils 132, 134 can include a rigid ceramic material, patterned with metallic trace such as titanium-gold. The RF excitation coils 132, 134 may comprise a single turn loop, of circumference less than the dimension of the RF wavelength (speed-of-propagation/9.19 GHz). The RF excitation loop may comprise an integrated impedance transformer and balun-structure to allow for controlled 9.19 GHz magnetic field line directionality. Such a patterned ceramic excitation loop may be placed so as to not make physical contact with the alkali-vapor cell (so as to not disrupt the cell thermal isolation) but to allow for the magnetic-field component of the 9.19 GHz excitation to interact with the optical pumped atomic vapor. Note, the dimensions of the alkali-vapor cell are also submicrowave-wavelength, allowing for single-turn excitation without need for bulky microwave cavities. The photodiode 138 overlies the upper heater/RTD 130 flex circuit. The overall width of the physics package as assembled is about 8 mm or less, while the dimensions of the cubically-shaped alkali vapor cell 131 is about 2 mm or less.

Figure 8:
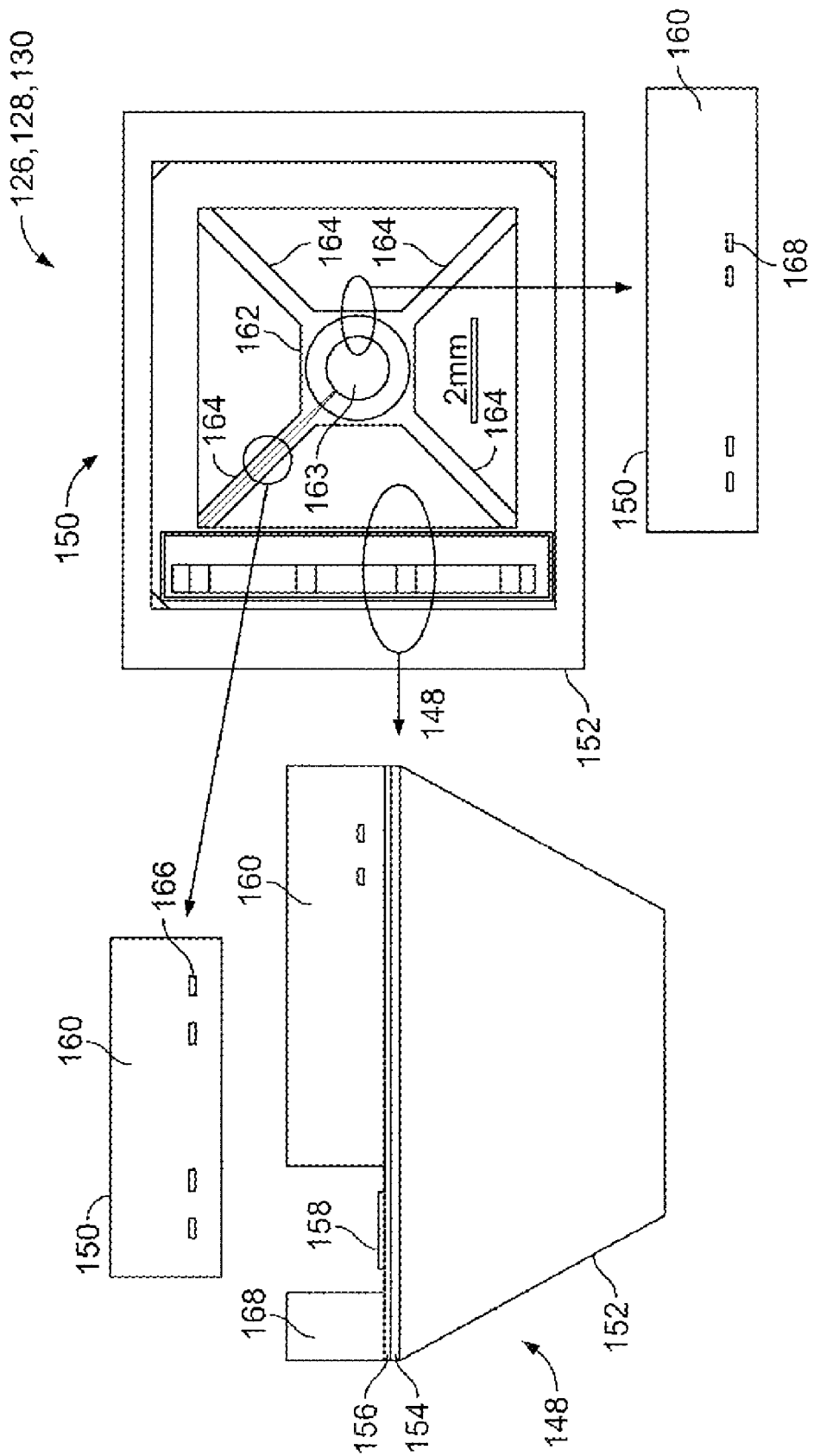
FIG. 8 is a top plan view of the physical design of a flex circuits used in conjunction with the physics package assembly of FIG. 6.

Referring now to FIG. 8, the physical design of the flex circuits 126, 128, 130 is depicted. The flex circuits 126, 128, 130 are thermally isolating supports for the alkali vapor cell 131 and the VSCEL 139. The flex circuits 126, 128, 130 are manufactured on a silicon wafer using standard batch fabrication processes such as photolithography, etc., and can be utilized with large-diameter silicon wafer technology. The flex circuits 126, 128, 130 includes a silicon substrate, preferably n-doped and about 525 um thick, a polyimide support structure 148 and a polyimide support structure 150. The polyimide support structure 148 comprises a number of layers resting on silicon frame 152. An SiC insulating layer 154 is deposited on the silicon substrate 152 for protection of the underlying silicon frame 152. An $SiO_2$ insulating layer 156 is deposited overlying the SiC insulating layer 154 and is utilized for bond pad adhesion. A bond pad 158 rests upon a portion of the $SiO_2$ insulating layer 156. The bond pad 158 is made of a Ti—Au alloy, and provides an electrical connection to the outside world. Surrounding the bond pad 158 is a 16 um layer of polyimide 160, which is the primary thermal insulating material of the flex circuits 126, 128, 130. The polyimide layer 160 is constructed from two layers: a 1 um layer followed by a 15 um layer. The polyimide layers may encase and are bonded to trace leads and heater lines. The polyimide support structure 150 has a center square portion 162 with a central circular opening 163 which is supported by four radiating spokes 164 which extend from the center square portion 162 to the rectangular polyimide support structure 148. The electrical trace leads 166 are fashioned from Ti—Au, while heater and RTD temperature sensor leads 168 are fashioned from Ti—Pt. The Ti—Pt heater and RTD sensor leads 168 are approximately 50 nm in thickness of Ti, 500 nm in thickness of Pt. The bond pad 158 utilized 50 nm in thickness of Ti, 950 nm in thickness of Au. The heater and RTD lines have target resistances of about 400 ohms and 1500 ohms, respectively. The heater and RTD lines include 10-um wide metal traces that are patterned in a counter-propagating serpentine fashion. This provides the needed electrical resistance (to get the correct thermal properties) and also self-cancels magnetic fields induced by current propagation.

The major processing steps in making the flex circuits 126, 128, 130 are listed below:

a. Deposit SiC on 100 mm diameter, 500 μm thick Si wafer as an etch mask for subsequent KOH etching.

b. Pattern test features in the SiC and etch exposed Si in KOH to determine the (1 1 0) crystal plane. Wafer flats are not accurate as alignment features.

c. Deposit 125 nm of $SiO_2$.

d. Coat, pattern and cure a 1 μm thick polyimide (HD Microsystems) layer.

e. Coat and cure an additional 1 μm thick polyimide layer that is unpatterned.

f. Sputter coat 50 nm Ti, 500 nm Pt, for the heater and RTD.

g. Pattern the TiPt with ion milling using a photoresist mask.

h. Plasma etch polyimide until bond pad areas are cleared (essentially removing unpatterned polyimide).

Figure 9:
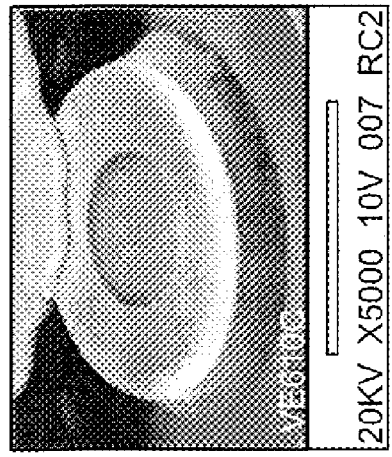
FIG. 9 is a perspective view micrograph of a batch fabricated, D1-line VSCEL, used in conjunction with the physics package assembly of FIG. 6.

Referring now to FIG. 9, a micrograph of a batch fabricated, D1-line VSCEL 170 used in conjunction with the present invention, is depicted. The VSCEL 170 is designed for operation at temperatures greater than about 50° C., the VSCEL 170 having a threshold current of about 280 uA at a temperature of about 80° C. RF interrogation allows for DC biasing of the VSCEL. The VSCEL 170 emits light of a single mode which is linearly polarized. White noise generated by the VSCEL is at a level below −150 dBc/Hz. RIN noise in a 1 KHz band is about −135 dBc/HZ. A single VSCEL 170 has a chip dimension of about 300 um. The VSCEL 170 is bonded to the polyimide support structure 150 of FIG. 8 with the center of the VSCEL 170 in line with the center of the central circular opening 163 of the center square portion 162.

Figure 10:
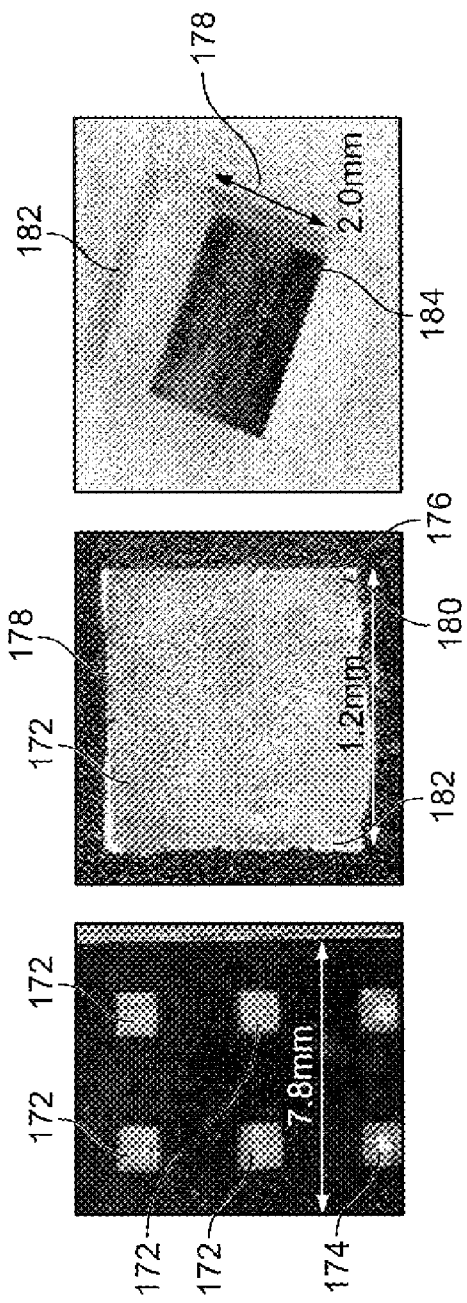
FIG. 10 is a micrograph of a top plan view of an alkali vapor cell, used in conjunction with the physics package assembly of FIG. 6.

Referring to FIG. 10, alkali vapor cells 172 used in conjunction with the present invention are depicted. The alkali vapor cells 172 are batch fabricated on a wafer of silicon 174 in 4×4 arrays. The outer walls 176 of the alkali vapor cell body 178 are made from high-resistance silicon having dimensions of about 1.2 mm on a side. A droplet of an alkali metal in liquid form, preferably cesium, 180 is pin-transfer deposited at about 30° C. on the inner walls 182. The cell body is also back-filled with an $ArN_2$ mixture at about 0.5 atm buffer gas pressure (at operating temperature) to minimize changes in clock frequency due to changes in cell temperature. Buffer gas is used within the alkali-vapor cell to prevent disruptive line-broadening effect, when cesium atom contacts with the cell wall. The cell body 178 is capped with 275° C. pyrex on one end 184 and 240° C. on its other end 186.

Figure 11A:
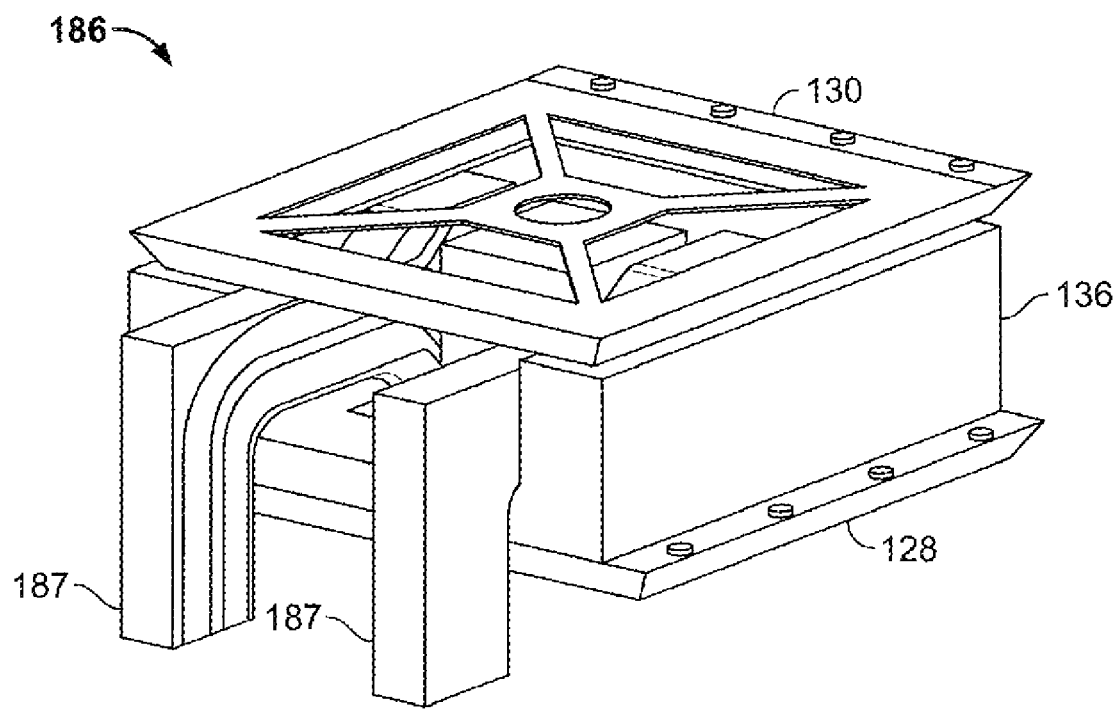
FIG. 11A is a perspective view of the RF interrogation physical design assembly, used in conjunction with the physics package assembly of FIG. 6.
Figure 11B:
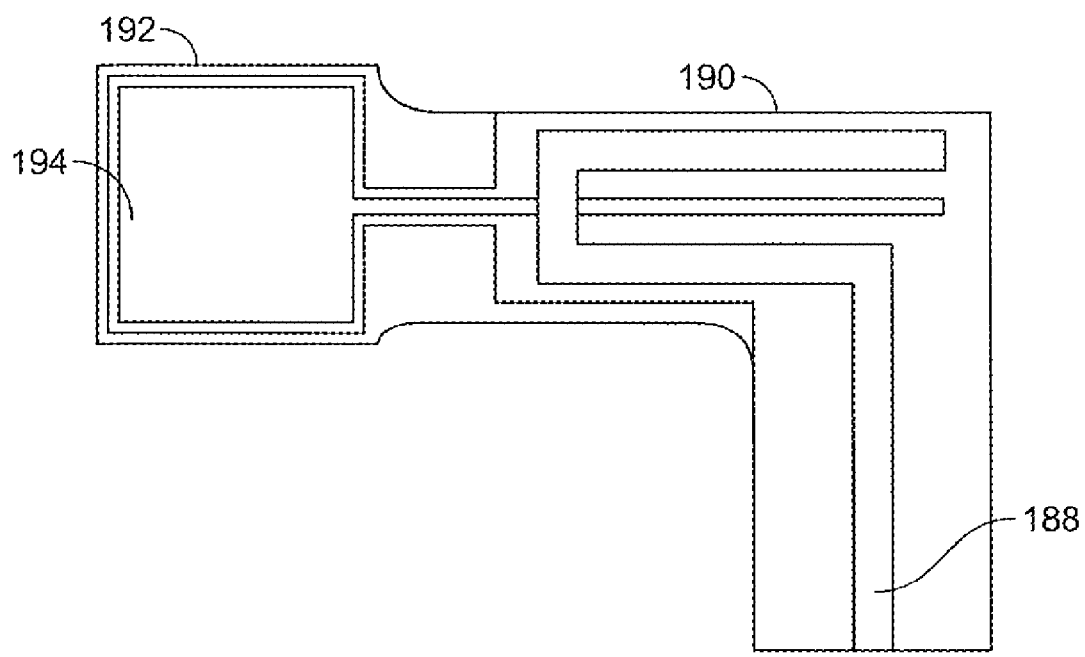
FIG. 11B is a perspective view of the RF interrogation loop assembly, used in conjunction with the physics package assembly of FIG. 6.
Figure 11C:
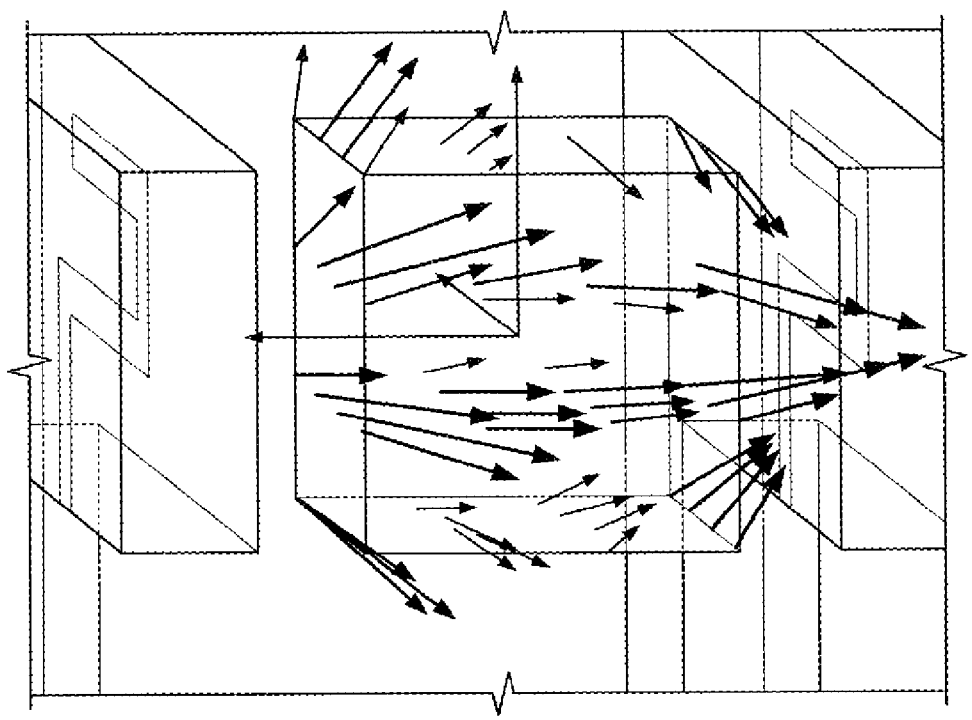
FIG. 11C is a perspective view of the field lines generated by a pair of RF interrogation physical design assemblies in the presence of an alkali vapor cell.

Referring now to FIGS. 11A-11C, the RF interrogation physical design scheme of the present invention is depicted. FIG. 11A shows a fully assembly 186 which includes the lower and upper heater-RTD flex circuits 128, 130, which sandwich the ceramic spacer 136 and vapor cell (not shown). An RF excitation coil assembly 187 comes in to the assembly 186 at right angles to the flex circuits 128, 130 so that RF power can be injected into the alkali vapor cell 131 without touching the alkali vapor cell 131 In FIG. 11B, the assembly 186 includes an RF microstrip (transmission line) 188 for supplying the driving RF fields based on about a 0.5 mA input current. A balun 190 couples the driving magnetic field of the microstrip 188 to an electrically isolated single turn RF loop 192. The RF loop applies the RF interrogation B field to the alkali vapor cell 131 The single turn RF loop 192 is patterned on an alumina substrate 194. The input impedance of the RF microstrip 188 is matched to a driving circuit (not shown). The balun 190 allows for effective cancellation of stray fields to provide a desired in-line directionality of the B-field component of the RF field transversely through the alkali vapor cell 131 as depicted in FIG. 11C.

Figure 12:
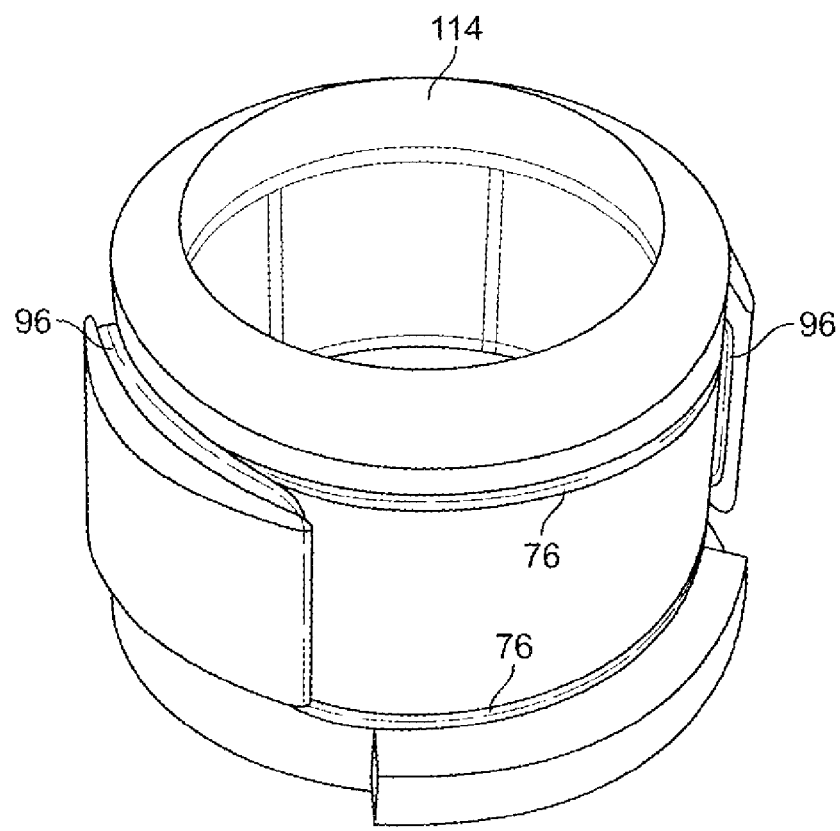
FIG. 12 is a photograph of a perspective view of the bobbin with Z-axis and X-axis Helmholtz coils attached, used in conjunction with the physics package assembly of FIG. 6.

Referring now to FIG. 12, a photograph of a perspective view of the bobbin 114 with Z-axis Helmholtz coils 76 and X-axis Helmholtz coils 96 attached is depicted. Using a pair of Helmholtz coils of a particular design and aligned in parallel to each other and whose centers are aligned to intersect the center of the alkali vapor cell 131 allows for maintaining a field uniformity of better than 0.5% over the region of the 2 mm alkali vapor cell 131. A 0.5% uniformity places requirements on the design of the coils such that each has a diameter of about 16 mm. The copper wire used to produce the coils 76, 96 has a diameter of about 2 mil of copper wound with 40 turns. The x-axis Zeeman modulation field coils 96 are wound on the same bobbin 114 as the z-axis coils 76, the x-axis coils being made of 40 turns of 2 mil copper wire.

FIG. 13 is a parts list of the supporting control and servo-feedback loop electronics used in conjunction with the present invention. The parts list of FIG. 13 also the includes power consumption and current drawn of each part. The high frequency electronics comprising the 9.19 Ghz feedback loop 54 includes a commercial 4.6 GHz PLL/VCO system with a custom Marchand frequency doubler and a Wilkensen splitter to drive integrated RF interrogation loops. Control of the loops is based on digital microprocessor control using commercial components. The VCO 80 can be, for example, a commercial part manufactured by Z-comm which dissipates about 40 mW, or a custom-made VCO which dissipates about 10 mW of power. Other features of the electronics include separate digital and RF printed circuit boards as well as RF amplitude control.

The present invention has numerous advantages over prior art chip scale atomic clocks. Direct RF interrogation of an end-state transition allows for interrogation of the hyperfine field of the alkali atoms without the need for a microwave resonant cavity. The RF drive power needed scales for atomic cell dimension, which are on order of microwatts for millimeter cells. Having a miniature atomic vapor cell allows for reduced thermal load (reduced cell radiative thermal loss), reduced power consumption, and reduced clock physical volume. A set of miniature Helmholtz coils provides for a z-axis bias B-field (in direction of laser). A miniature modulated x-axis Zeeman B-field allows for interrogation of the magnetically-sensitive Zeeman resonance. When operated in conjunction with an RF feedback loop, the system can compensate the bias B-field to offset any clock frequency shifts that are experienced when a stray magnetic field is introduced into the system. As the end-state energy levels are sensitive to magnetic field (and hence cause clock frequency drift), the Zeeman and RF field interrogations can compensate for shifts in stray magnetic fields, which is important for clock stability. The dominant mechanism for long-term drifts is due to "light shifts" and these light shifts 'look like' magnetic field shifts (Stark shifts). The feedback loop used to compensate for magnetic field shifts can also compensate for light shifts. Most of the components of the present invention can be batch-fabricated (CW VCSEL laser, atomic-vapor cell, thermally isolating supports, heater units, thermal sense units, RF loops) and are all designed, fabricated, and integrated with a scalable system view in mind. The physics package containing these elements resides in a volume of less than $0.3 \text{ cm}^3$ and consumes about 20 mW of power. The system is capable of continual scaling in power and volume (reduced power and volume) as the atomic vapor cell scales from 2 mm to 200 um dimensions.

It is to be understood that the exemplary embodiments are merely illustrative of the invention and that many variations of the above-described embodiments may be devised by one skilled in the art without departing from the scope of the invention. It is therefore intended that all such variations be included within the scope of the following claims and their equivalents.

What is claimed is:

1. An atomic clock, comprising:
   a vapor cell containing alkali atoms;
   a laser source configured to pump an optical signal through said alkali atoms along a first axis containing the vapor cell, said alkali atoms being excited into an end resonance state;
   a photodetector configured to detect a second optical signal emanating from said vapor cell substantially along the first axis;
   a pair of RF excitation coils configured to apply an RF-interrogation signal to said alkali atoms substantially along a second axis substantially perpendicular to said first axis;
   a pair of bias coils configured to apply a substantially uniform DC magnetic field to said alkali atoms substantially along said first axis; and
   a pair of Zeeman coils configured to apply a time-varying magnetic field to said alkali atoms substantially along said second axis.

2. The atomic clock of claim 1, wherein the RF-interrogation signal has a wavelength that is larger than the dimensions of said alkali vapor cell.

3. The atomic clock of claim 1, wherein each of said pair of RF excitation coils, said bias coils, and said Zeeman coils are proximal to and physically and thermally isolated from said alkali vapor cell.

4. The atomic clock of claim 1, wherein said alkali atoms are cesium atoms.

5. The atomic clock of claim 1, wherein said laser source is a vertical cavity surface emitting laser (VSCEL).

6. The atomic clock of claim 1, wherein said photodetector is a photodiode.

7. The atomic clock of claim 1, wherein said bias coils are Helmholtz coils.

8. The atomic clock of claim 1, further comprising an argon-nitrogen gas mixture encased within the alkali vapor cell for immunizing an atomic clock frequency derived from said alkali atoms from changes to temperature within said alkali vapor cell.

9. The atomic clock of claim 1, further comprising a feedback loop for maintaining the wavelength of the laser source.

10. The atomic clock of claim 9, wherein said feedback loop maintains the wavelength of said laser source by applying to a heater thermally coupled to said laser source and detecting and demodulating from said photodetector a dithering signal of about 23 KHz.

11. The atomic clock of claim 1, further comprising a feedback loop for maintaining a frequency of said RF interrogation signal.

12. The atomic clock of claim 1, wherein said frequency of said RF interrogation signal is about 9.19 GHz for cesium.

13. The atomic clock of claim 12, wherein said feedback loop maintains a frequency of said RF interrogation signal by applying to said RF excitation coils and detecting and demodulating from said photodetector a dithering signal of about 2.9 KHz.

14. The atomic clock of claim 12, wherein an atomic clock time base of about 10 MHz is derived from said feedback loop.

15. The atomic clock of claim 14, further comprising a second feedback loop for deriving and maintaining a frequency of said Zeeman interrogation signal.

16. The atomic clock of claim 15, wherein said frequency of said Zeeman interrogation signal applied to said Zeeman coils is in the range of from 10 KHz to 300 KHz.

17. The atomic clock of claim 16, wherein said frequency of said Zeeman interrogation signal applied to said Zeeman coils is about 30 KHz.

18. The atomic clock of claim 17, wherein said second feedback loop maintains a frequency of said Zeeman interrogation signal by applying to said Zeeman interrogation coils and detecting and demodulating from said photodetector a dithering signal of about 700 Hz.

19. The atomic clock of claim 18, wherein said second feedback loop adjusts the DC magnetic field produced by said DC bias coils based on the DC response from said second feedback loop so as to compensate for external magnetic fields and to compensate for clock frequency shifts due to light shifts.

20. A method of operating an atomic clock comprising a vapor cell containing alkali atoms, comprising the steps of:
pumping alkali atoms within said alkali vapor cell into an end resonance state using an optical signal applied along a first axis;
detecting the optical signal emanating from the alkali atoms at the photodetector substantially along said first axis;
applying an RF-interrogation signal to said alkali atoms along a second axis substantially perpendicular to the first axis;
applying a substantially uniform DC magnetic field substantially along the first axis through said vapor cell; and
applying a time-varying magnetic field using Zeeman coils substantially along the second axis through said vapor cell.

21. The method of claim 20, further comprising the step of maintaining the temperature of said laser source by applying to a heater thermally coupled to said laser source and detecting from said photodetector a dithering signal.

22. The method of claim 20, further comprising the step of applying to said RF excitation coils and detecting from said photodetector a dithering signal for maintaining a frequency of said RF interrogation signal.

23. The method of claim 22, wherein the frequency of said RF interrogation signal is about 9.19 GHz and the frequency of said dithering signal is about 2.9 KHz.

24. The method of claim 23, further comprising the step of applying to said Zeeman interrogation coils and detecting from said photodetector a second dithering signal for deriving and maintaining a frequency of said Zeeman interrogation signal.

25. The atomic clock of claim 24, wherein said frequency of said Zeeman interrogation signal applied to said Zeeman coils is about 30 KHz and said second dithering signal is about 700 Hz.

26. The method of claim 25, further comprising the step of applying to said DC bias coils a DC bias signal based on a DC response from said Zeeman interrogation signal for rendering the alkali atoms in the alkali vapor cell immune to shifts in external stray magnetic fields and light shifts of the laser source.

* * * * *